(12) United States Patent
Ellis-Monaghan et al.

(10) Patent No.: US 9,171,971 B2
(45) Date of Patent: Oct. 27, 2015

(54) ENCAPSULATED SENSORS

(71) Applicant: INTERNATIONAL BUSINESS MACHINES CORPORATION, Armonk, NY (US)

(72) Inventors: John J. Ellis-Monaghan, Grand Isle, VT (US); Jeffrey P. Gambino, Westford, VT (US); Mark D. Jaffe, Shelburne, VT (US); William J. Murphy, North Ferrisburgh, VT (US); Kirk D. Peterson, Jericho, VT (US); Steven M. Shank, Jericho, VT (US)

(73) Assignee: GLOBALFOUNDRIES U.S. 2 LLC, Hopewell Junction, NY (US)

( * ) Notice: Subject to any disclaimer, the term of this patent is extended or adjusted under 35 U.S.C. 154(b) by 81 days.

(21) Appl. No.: 14/068,461

(22) Filed: Oct. 31, 2013

(65) Prior Publication Data

US 2015/0115270 A1   Apr. 30, 2015

(51) Int. Cl.
*H01L 31/0203* (2014.01)
*H01L 31/20* (2006.01)

(52) U.S. Cl.
CPC .......... *H01L 31/0203* (2013.01); *H01L 31/208* (2013.01)

(58) Field of Classification Search
CPC .. G02B 6/12004; G02B 6/136; H01L 31/105; H01L 31/1808; H01L 31/09; H01L 31/153; H01L 31/1864

USPC .......... 257/432, E27.133, E21.585, E31.079; 438/68, 29, 31
See application file for complete search history.

(56) References Cited

U.S. PATENT DOCUMENTS

| | | |
|---|---|---|
| 5,228,948 A | 7/1993 | Deguchi |
| 7,405,098 B2 | 7/2008 | Lee et al. |
| 7,547,914 B2 | 6/2009 | Kermarec et al. |
| 7,675,056 B2 | 3/2010 | Lee et al. |
| 7,790,495 B2 | 9/2010 | Assefa et al. |
| 7,902,620 B2 | 3/2011 | Assefa et al. |
| 8,178,382 B2 | 5/2012 | Assefa et al. |
| 2012/0129302 A1 | 5/2012 | Assefa et al. |
| 2012/0213468 A1 | 8/2012 | Lipson et al. |

OTHER PUBLICATIONS

Specification and Drawings for U.S. Appl. No. 13/629,910, filed Sep. 28, 2012, not published yet, 26 pages.

*Primary Examiner* — David Vu
*Assistant Examiner* — Jonathan Han
(74) *Attorney, Agent, or Firm* — Michael LeStrange; Roberts Mlotkowski Safran & Cole, P.C.

(57) ABSTRACT

An encapsulated sensors and methods of manufacture are disclosed herein. The method includes forming an amorphous or polycrystalline material in contact with a layer of seed material. The method further includes forming an expansion space for the amorphous or polycrystalline material. The method further includes forming an encapsulation structure about the amorphous or polycrystalline material. The method further includes crystallizing the amorphous or polycrystalline material by a thermal anneal process such that the amorphous or polycrystalline material expands within the expansion space.

19 Claims, 8 Drawing Sheets

ENCAPSULATED SENSORS

FIELD OF THE INVENTION

The invention relates to semiconductor structures and, more particularly, to encapsulated sensors and methods of manufacture.

BACKGROUND

Photosensors or photodetectors are sensors that detect light or other electromagnetic energy. There are several varieties of photosensors or photodetectors, many of which are manufactured using conventional CMOS technologies. For example, photosensors or photodetectors can be active pixel sensors (APS) commonly used in cellular telephone cameras, web cameras, and even some digital single-lens reflex (DSLR) cameras. These type of image sensors have emerged as an alternative to charge-coupled device (CCD) sensors.

Many types of photosensors or photodetectors implement CMOS integrated nanophotonics circuits. These nanophotonics circuits include crystalline materials like germanium or III-V compounds, which are desirable for use as the active element in photodetector components. This is due to their high quantum efficiency. In the manufacturing process, the crystalline materials are encapsulated in order to protect the crystalline structure from other manufacturing processes.

Using liquid phase epitaxy, amorphous or polycrystalline films (e.g., germanium or III-V compounds) can be deposited at low temperatures in an amorphous or polycrystalline state, and then crystallized thermally. This technique provides for a high degree of integration flexibility. During the crystallization anneal, though, the amorphous or polycrystalline material (e.g., Ge) expands and contracts, creating stress on the encapsulation films. This stress can create a breach in the encapsulation, resulting in defects that can subsequently degrade the operation of the photodetector. For example, Ge recrystallization anneal creates stress points which penetrate the encapsulation structure breaching the integrity of the encapsulation and leaking Ge out of the structure. The main defect type is the removal of Ge during silicide formation by the wet cleans that access the Ge through the breach in the encapsulation.

Accordingly, there exists a need in the art to overcome the deficiencies and limitations described hereinabove.

SUMMARY

In an aspect of the invention, a method comprises forming an amorphous or polycrystalline material in contact with a layer of seed material. The method further comprises forming an expansion space for the amorphous or polycrystalline material. The method further comprises forming an encapsulation structure about the amorphous or polycrystalline material. The method further comprises crystallizing the amorphous or polycrystalline material by a thermal anneal process such that the amorphous or polycrystalline material expands within the expansion space.

In an aspect of the invention, a method comprises forming a lower encapsulating layer on an active semiconductor layer. The method further comprises forming an amorphous or polycrystalline material on the lower encapsulating layer and in contact with a layer of seed material. The method further comprises forming an upper encapsulating layer over the amorphous or polycrystalline material to fully encapsulate the amorphous or polycrystalline material. The method further comprises forming an expansion space for the amorphous or polycrystalline material under the upper encapsulating layer. The method further comprises annealing the amorphous or polycrystalline material which crystallizes and expands within the expansion space.

In an aspect of the invention, a sensor structure comprises: a crystallized amorphous or polycrystalline material in contact with a layer of seed material and provided within an encapsulation structure; and an expansion space for expansion of the amorphous or polycrystalline material during a thermal anneal process.

In another aspect of the invention, a design structure tangibly embodied in a machine readable storage medium for designing, manufacturing, or testing an integrated circuit is provided. The design structure comprises the structures of the present invention. In further embodiments, a hardware description language (HDL) design structure encoded on a machine-readable data storage medium comprises elements that when processed in a computer-aided design system generates a machine-executable representation of the encapsulated sensors, which comprises the structures of the present invention. In still further embodiments, a method in a computer-aided design system is provided for generating a functional design model of the encapsulated sensors. The method comprises generating a functional representation of the structural elements of the encapsulated sensors.

BRIEF DESCRIPTION OF THE SEVERAL VIEWS OF THE DRAWINGS

The present invention is described in the detailed description which follows, in reference to the noted plurality of drawings by way of non-limiting examples of exemplary embodiments of the present invention.

DETAILED DESCRIPTION

The invention relates to semiconductor structures and, more particularly, to encapsulated sensors and methods of manufacture. More specifically, the present invention is directed to encapsulated recrystallized amorphous/polycrystalline/polysilicon material sensors and methods of manufacture. In embodiments, the sensors can be any amorphous/polycrystalline/polycrystalline materials such as germanium or III-V compounds which, upon thermal anneal, will crystallize. Advantageously, the present invention provides sensors that eliminates defects, which would otherwise be formed during crystallization processes.

In embodiments, the sensors are accomplished by providing stress relief structures which can be formed prior to the source/drain anneal. For example, the stress relief structures can be structures that allow Ge or other III-V compounds to expand and contract without putting excessive stress on the encapsulation film. These structures can range from air gaps or spaces formed adjacent the Ge or other III-V compound material, voids or pores formed within the Ge or other III-V compound material, or other structures as described herein. In any of the embodiments, though, the stress relief structures of the present invention provide space for expansion of the Ge or other III-V compound material during the crystallization process, e.g., thermal anneal melt process, thereby preventing cracking of the encapsulating material during the thermal anneal process.

The encapsulated sensors of the present invention can be manufactured in a number of ways using a number of different tools. In general, though, the methodologies and tools are used to form small structures with dimensions in the micrometer scale. The methodologies, i.e., technologies, employed to manufacture the encapsulated sensors of the present invention have been adopted from integrated circuit (IC) technology. For example, the stress relieve structures of the present invention are built on wafers and are realized in films of material patterned by photolithographic processes on the top of a wafer. In particular, the fabrication of the encapsulated sensors of the present invention uses three basic building blocks: (i) deposition of thin films of material on a substrate, (ii) applying a patterned mask on top of the films by photolithographic imaging, and (iii) etching the films selectively to the mask.

Figure 1:
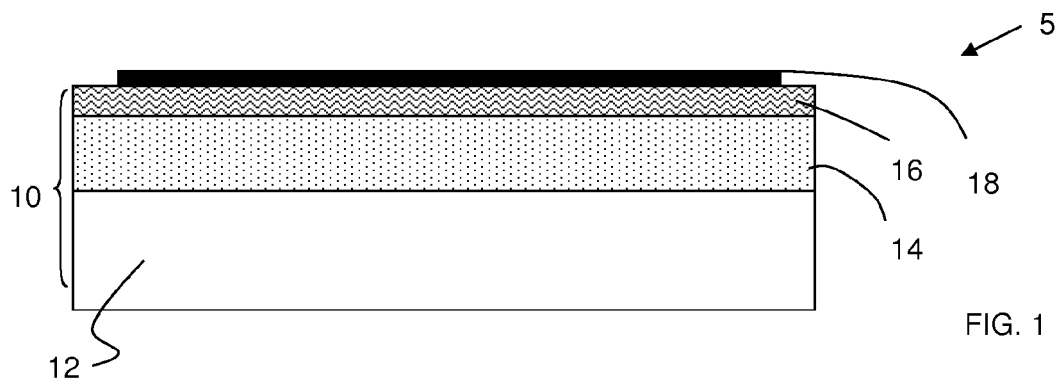
FIGS. 1-3 show processing steps and respective structures in accordance with aspects of the present invention.
Figure 2:
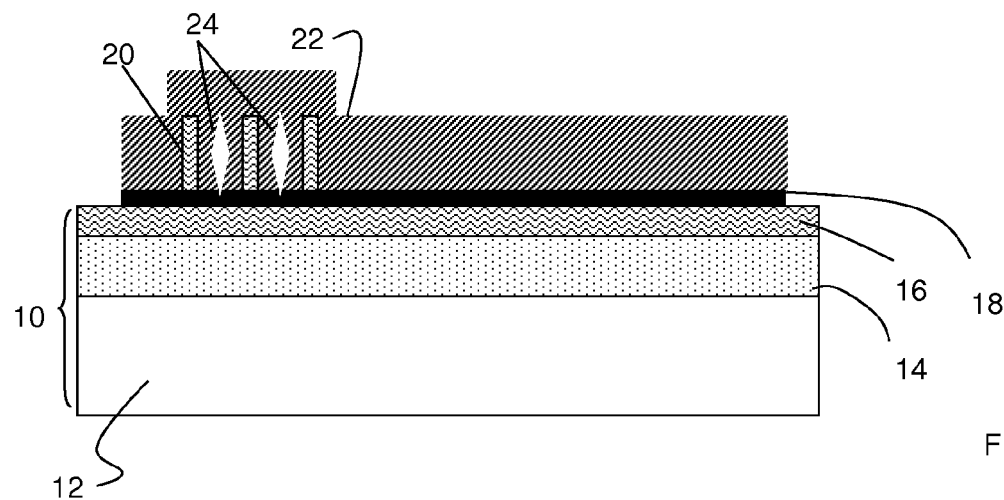
Figure 3:
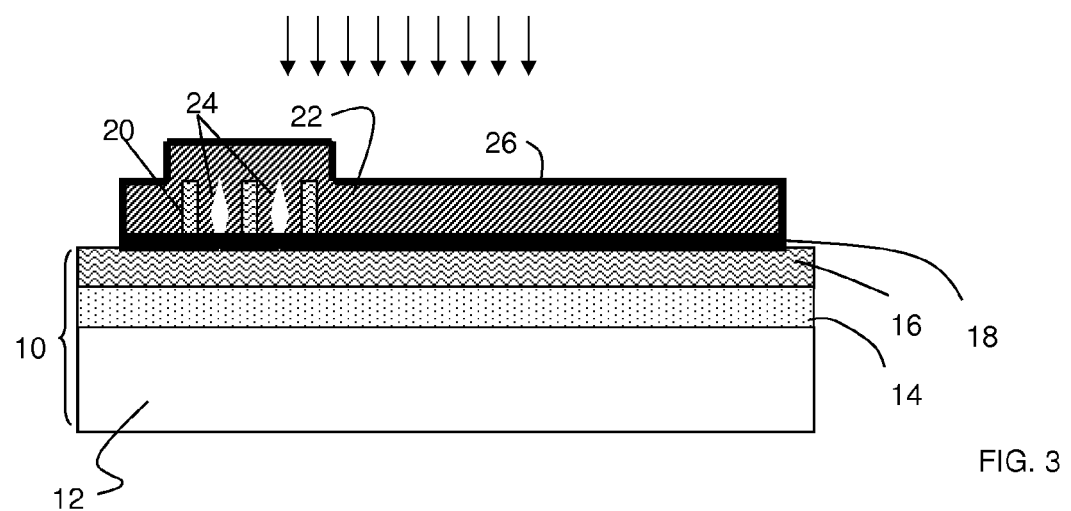

FIGS. 1-3 show processing steps and respective structures in accordance with a first aspect of the present invention. More specifically, FIG. 1 shows a structure 5 comprising either a bulk wafer or an SOI wafer 10. In the SOI wafer implementation, an insulation layer (e.g., BOX) 14 is formed on top of a wafer (bulk substrate) 12, with a single crystalline active semiconductor layer 16 (e.g., active silicon) formed on the BOX 14. In embodiments, the constituent materials of the SOI wafer 10 may be selected based on the desired end use application of the semiconductor device. For example, the BOX 14 may be composed of oxide, such as $SiO_2$. Moreover, the single crystalline active semiconductor layer 16 can be comprised of various semiconductor materials, such as, for example, Si, SiGe, SiC, SiGeC, etc. The SOI wafer 10 may be fabricated using techniques well known to those skilled in the art, e.g., oxygen implantation (e.g., SIMOX), wafer bonding, etc.

Still referring to FIG. 1, an encapsulating material 18 is formed on the active semiconductor layer 16. In embodiments, the encapsulating material 18 can be nitride, oxide or other hardmask materials deposited using conventional CMOS deposition processes, e.g., chemical vapor deposition (CVD) processes. In each of the embodiments, the encapsulating material 18 can have a thickness of about 500 Å; although other dimensions are also contemplated by the present invention. In embodiments, the encapsulating material 18 can be patterned using a conventional lithography and etching process. By way of non-limiting illustrative example, a resist formed on the encapsulating material 18 can be exposed to energy (light) to form a pattern (openings). A reactive ion etching (RIE) is performed on the exposed portions of the encapsulating material 18 to pattern the encapsulating material 18. The resist can then be removed by a conventional stripping process, e.g., oxygen ashing.

Figure 7:
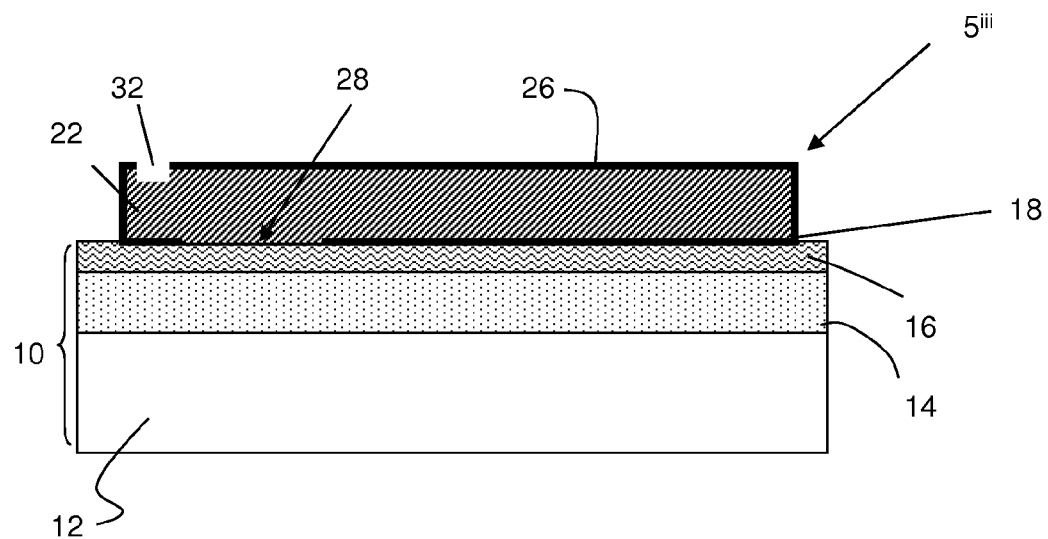
FIGS. 7 and 8 show processing steps and respective structures in accordance with additional aspects of the present invention.

In FIG. 2, a polysilicon material is formed on the encapsulating material 18 and patterned to form poly structures 20 with minimum spacing therebetween. By way of example, polysilicon material is deposited using conventional processes, e.g., CVD, and patterned to form the poly structures 20 with minimum spacing therebetween. In embodiments, the minimum spacing between the poly structures 20 can be about 0.1 micron; although other minimum spacing is also contemplated by the present invention depending on the technology node. The poly structures 20 (or an opening 28 as seen in FIG. 7) will act as a seed layer to crystallize subsequently formed amorphous or polycrystalline material, e.g., Ge or other III-V compound material, during subsequent annealing processes.

Still referring to FIG. 2, in embodiments, amorphous or polycrystalline material 22, e.g., Ge or other III-V compound material, is formed on the encapsulating material 18 and poly structures 20. Due to the minimum spacing between the poly structures 20, the amorphous or polycrystalline material 22 will only partially fill the space between the poly structures 20, thereby creating voids 24 therebetween. The amorphous or polycrystalline material 22 then undergoes conventional lithography and etching (e.g., RIE) processes known to those of skill in the art.

As shown in FIG. 3, an encapsulating material 26, e.g., nitride, oxide or other hardmask material, is formed over the amorphous or polycrystalline material 22. In each of the embodiments, the encapsulating material 26 can create an encapsulation structure fully encapsulate the amorphous or polycrystalline material 22. Additionally, each of the embodiments, the encapsulating material 26 can have a thickness of about 500 Å; although other dimensions are also contemplated by the present invention. As represented by the arrows, the amorphous or polycrystalline material 22 undergoes an annealing process above the melting temperature of the material 22, e.g., greater than 950° C. for Ge. During this annealing process, the amorphous or polycrystalline material 22 melts and expands within the voids 24. The expansion of the crystallized amorphous or polycrystalline material 22 reduces stress on the encapsulating material 26 and hence prevents any crack formation within the encapsulating material 26. As should be understood by those of skill in the art, the annealing process will crystallize the amorphous or polycrystalline material 22.

Figure 4:
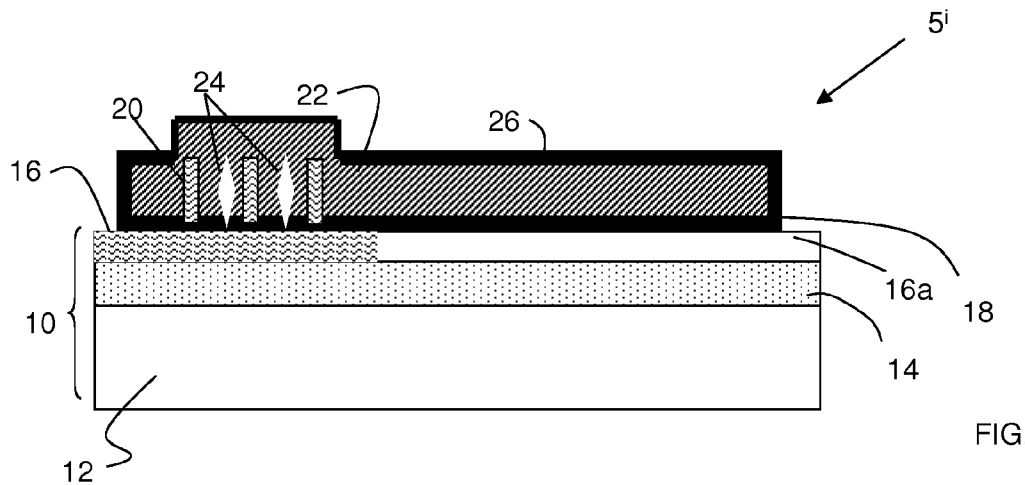
FIG. 4 shows processing steps and a respective structure in accordance with additional aspects of the present invention.

In FIG. 4, the structure $5^i$ includes shallow trench isolation (STI) structure 16a formed in the semiconductor layer 16. In implementations, the STI structure 16a is formed under the crystallized amorphous or polycrystalline material 22 using conventional lithography, etching and deposition processes. For example, after forming a shallow trench within the semiconductor layer 16 using lithography and etching processes, oxide or other insulating material is deposited within the shallow trench. Any excess oxide or other insulating material is then removed using, for example, a chemical mechanical planarization (CMP) process. The remaining structure is fabricated using the processes described with regard to FIGS. 1-3.

Figure 5:
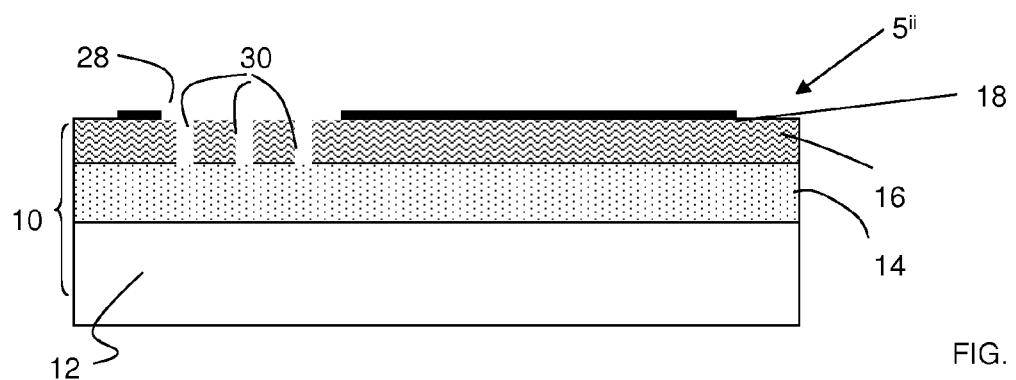
FIGS. 5 and 6 show processing steps and respective structures in accordance with additional aspects of the present invention.
Figure 6:
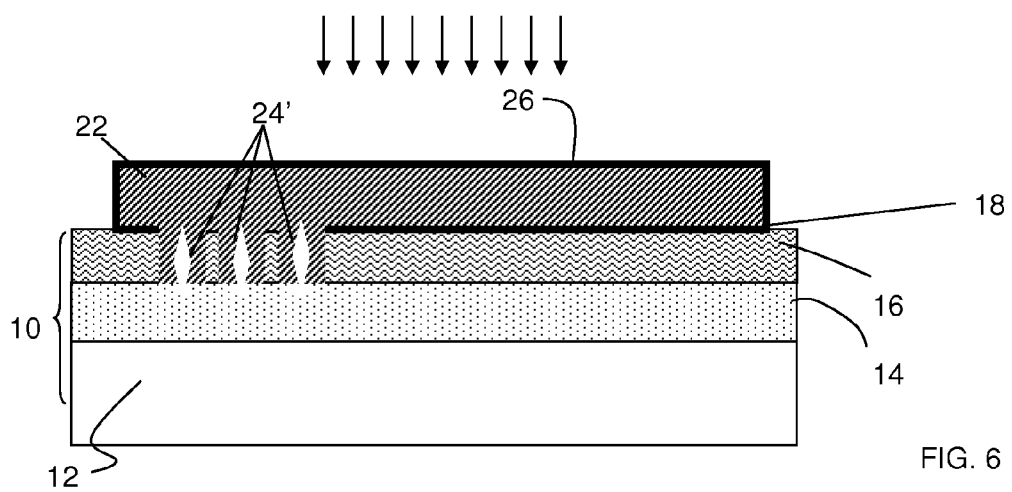

FIGS. 5 and 6 show processing steps and respective structures in accordance with additional aspects of the present invention. More specifically, FIG. 5 shows a structure $5^{ii}$ comprising either a bulk wafer or an SOI wafer 10 as already described herein. An encapsulating material 18, e.g., nitride, oxide or other hardmask materials, is deposited and patterned on the active semiconductor layer 16. During the patterning of the encapsulating material 18, an opening 28 is formed in the encapsulating material 18 to expose the underlying semiconductor layer 16. The underlying semiconductor layer 16 will act as a seed layer to crystallize the amorphous or polycrystalline material, e.g., Ge or other III-V compound material, during subsequent annealing processes. Trenches 30 are then formed in the semiconductor layer 16, using conventional lithography and etching processes as already described herein. In embodiments, the trenches 30 have a minimum spacing, e.g., width or diameter, of about 0.1 micron. (In alternative embodiments, the trenches 30 can be formed in the STI structure 16a of FIG. 4.)

In FIG. 6, amorphous or polycrystalline material 22, e.g., Ge or other III-V compound material, is formed on the encapsulating material 18 and within the trenches 30. Due to the minimum spacing of the trenches 30, the amorphous or polycrystalline material 22 will only partially fill the trenches 30 thereby creating voids 24' within the trenches 30. The amorphous or polycrystalline material 22 then undergoes conventional lithography and etching (e.g., RIE) processes known to those of skill in the art. An encapsulating material 26, e.g., nitride, oxide or other hardmask material, is formed over the amorphous or polycrystalline material 22. As represented by the arrows, the amorphous or polycrystalline material 22 undergoes an annealing process greater than the melting point of material 22, e.g., greater than about 950° C. for Ge. During this annealing process, the amorphous or polycrystalline material 22 expands within the voids 24', thereby reducing stress and preventing any crack formation within the encapsulating material 26. As should be understood by those of skill in the art, the annealing process will crystallize the amorphous or polycrystalline material 22.

Figure 8:
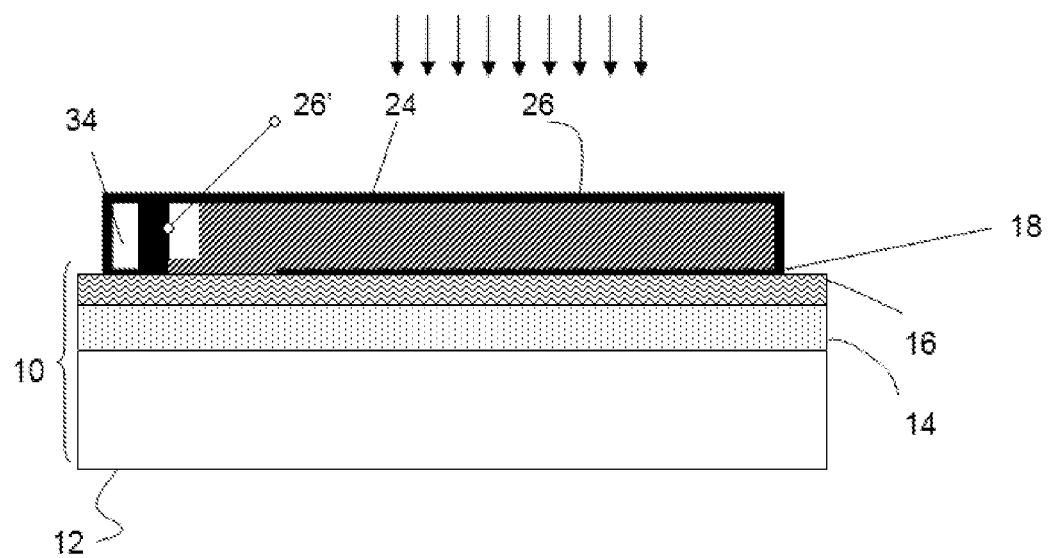

FIGS. 7 and 8 show processing steps and respective structures in accordance with additional aspects of the present invention. More specifically, FIG. 7 shows a structure $5^{iii}$ comprising either a bulk wafer or an SOI wafer 10 as already described herein. An encapsulating material 18, e.g., nitride, oxide or other hardmask materials, is deposited and patterned on the active semiconductor layer 16. During the patterning of the encapsulating material 18, an opening 28 is formed in the encapsulating material 18 to expose the underlying semiconductor layer 16. The underlying semiconductor layer 16 will act as a seed layer to crystallize the amorphous or polycrystalline material, e.g., Ge or other III-V compound material, during subsequent annealing processes.

Amorphous or polycrystalline material 22, e.g., Ge or other III-V compound material, is formed on the encapsulating material 18 and the exposed underlying semiconductor layer 16. An encapsulating material 26, e.g., nitride, oxide or other hardmask material, is formed over the amorphous or polycrystalline material 22. An opening or tap hole 32 is formed in the encapsulating material 26, exposing the amorphous or polycrystalline material 22. In embodiments, the opening 32 is formed using conventional etching processes, e.g., RIE.

As shown in FIG. 8, amorphous or polycrystalline material 22 is removed through the opening 32 to form a void or space 34 within the encapsulating material 18 and 26. The opening 32 is then sealed with additional encapsulating material 26', using conventional deposition processes, e.g., CVD processes. As represented by the arrows, the amorphous or polycrystalline material 22 undergoes an annealing process greater than the melting point of material 22, e.g., about 950° C. or more for Ge. During this annealing process, the amorphous or polycrystalline material 22 expands within the void or space 34, thereby reducing stress and preventing any crack formation within the encapsulating material 26. As should be understood by those of skill in the art, the annealing process will crystallize the amorphous or polycrystalline material 22.

Figure 9:
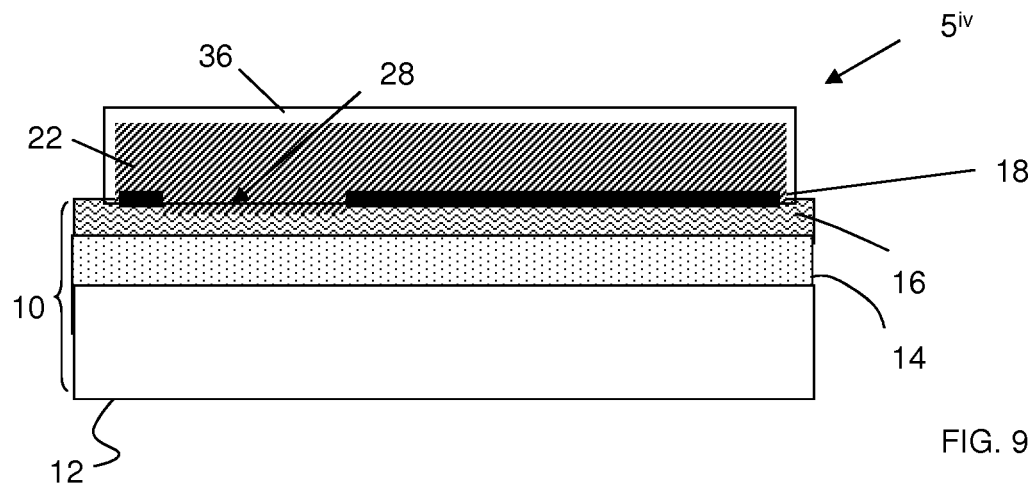
FIGS. 9-11 show processing steps and respective structures in accordance with additional aspects of the present invention.
Figure 10:
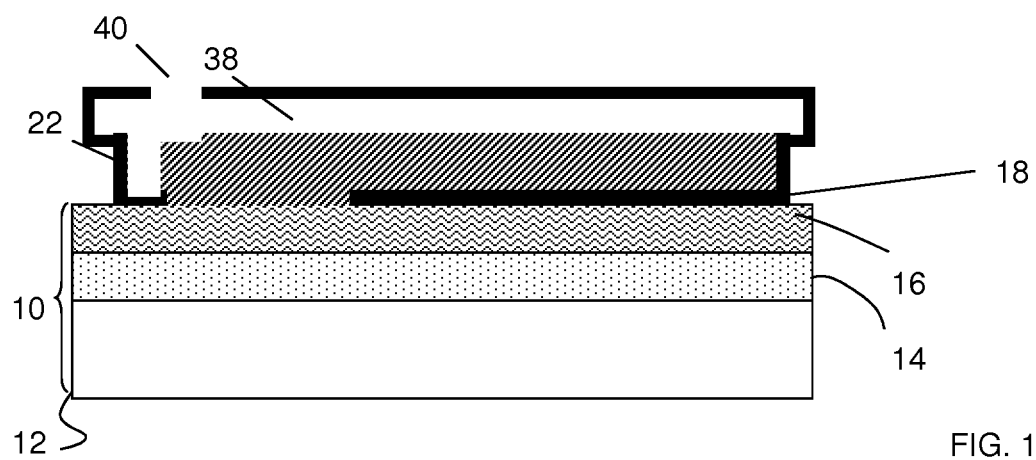
Figure 11:
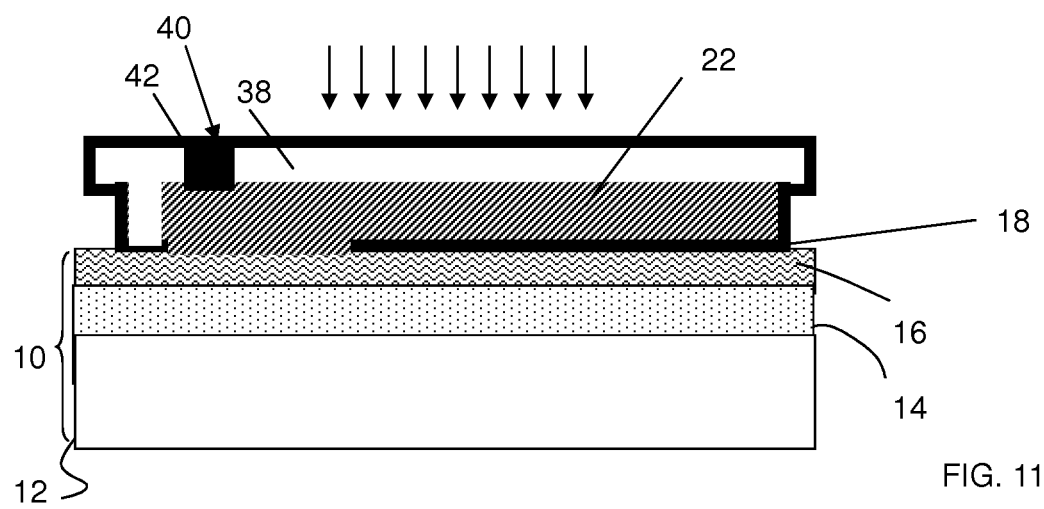

FIGS. 9-11 show processing steps and respective structures in accordance with additional aspects of the present invention. More specifically, FIG. 9 shows a structure $5^{iv}$ comprising either a bulk wafer or an SOI wafer 10 as already described herein. An encapsulating material 18, e.g., nitride, oxide or other hardmask materials, is deposited and patterned on the active semiconductor layer 16. During the patterning of the encapsulating material 18, an opening 28 is formed in the encapsulating material 18 to expose the underlying semiconductor layer 16. The underlying semiconductor layer 16 will act as a seed layer to crystallize the amorphous or polycrystalline material, e.g., Ge or other III-V compound material, during subsequent annealing processes.

Amorphous or polycrystalline material 22, e.g., Ge or other III-V compound material, is formed on the encapsulating material 18 and the exposed underlying semiconductor layer 16. The amorphous or polycrystalline material 22 undergoes an oxidation process to form, for example, $GeO_2$ layer 36. In an alternative process, $GeO_2$ can be deposited on the amorphous or polycrystalline material 22. In either scenario, the amorphous or polycrystalline material 22 and $GeO_2$ layer 36 undergo a patterning process using conventional lithography and etching processes.

As shown in FIG. 10, an encapsulating material 26, e.g., nitride, oxide or other hardmask material, is formed over the amorphous or polycrystalline material 22 and $GeO_2$ layer 36. An opening or tap hole 40 is formed in the encapsulating material 26, exposing the $GeO_2$ layer 36. The $GeO_2$ is removed through the opening to form a void or space 38 under the encapsulating material 26.

As shown in FIG. 11, the opening 40 is sealed with additional encapsulating material 42, using conventional deposition processes, e.g., CVD processes. As represented by the arrows, the amorphous or polycrystalline material 22 undergoes an annealing process greater than the melting point of material 22, e.g., greater than about 950° C. for Ge. During this annealing process, the amorphous or polycrystalline material 22 expands within the void or space 38, thereby reducing stress and preventing any crack formation within the encapsulating material 26. As should be understood by those of skill in the art, the annealing process will crystallize the amorphous or polycrystalline material 22.

Figure 12:
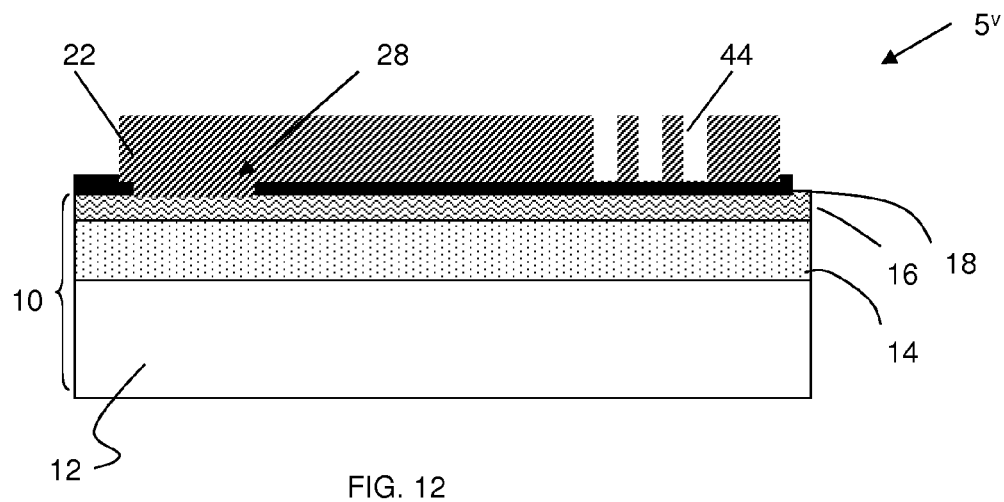
FIGS. 12 and 13 show processing steps and respective structures in accordance with additional aspects of the present invention.
Figure 13:
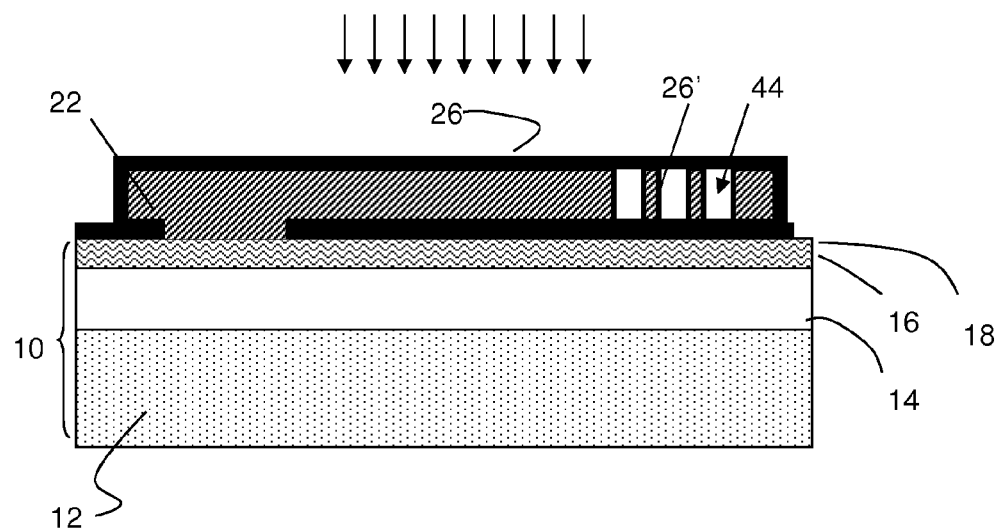

FIGS. 12 and 13 show processing steps and respective structures in accordance with additional aspects of the present invention. More specifically, FIG. 12 shows a structure $5^v$ comprising either a bulk wafer or an SOI wafer 10 as already described herein. An encapsulating material 18, e.g., nitride, oxide or other hardmask materials, is deposited and patterned on the active semiconductor layer 16. During the patterning of the encapsulating material 18, an opening 28 is formed in the encapsulating material 18 to expose the underlying semiconductor layer 16. The underlying semiconductor layer 16 will act as a seed layer to crystallize the amorphous or polycrystalline material, e.g., Ge or other III-V compound material, during subsequent annealing processes.

Still referring to FIG. 12, amorphous or polycrystalline material 22, e.g., Ge or other III-V compound material, is formed on the encapsulating material 18 and the exposed underlying semiconductor layer 16. Trenches 44 are formed in the amorphous or polycrystalline material 22 using conventional etching processes. In embodiments, the width or diameter of the trenches 44 is about 500 Å or other dimension small enough to ensure that encapsulating material does not completely fill in the trenches 44 during a subsequent deposition process.

As shown in FIG. 13, an encapsulating material 26, e.g., nitride, oxide or other hardmask material, is formed over the amorphous or polycrystalline material 22 and partly within the trenches 44. Due to the dimensions of the trenches 44, the encapsulating material 26 will plug the trenches prior to completely being filled, resulting in encapsulating material 26' on sidewalls of the trenches 44. As represented by the arrows, the amorphous or polycrystalline material 22 undergoes an annealing process greater than the melting point of material 22, e.g., greater than about 950° C. for Ge. During this annealing process, the amorphous or polycrystalline material 22 expands within the trenches 44 formed within the amorphous or polycrystalline material 22, thereby reducing stress and preventing any crack formation within the encapsulating material 26. More specifically, in this implementation, the expansion of the encapsulating material 26 will crack the encapsulating material 26' on the sidewalls of the trenches, as the material expands; however, the amorphous or polycrystalline material will still remain completely encapsulated by the encapsulating material 18 and 26. As should be understood by those of skill in the art, the annealing process will crystallize the amorphous or polycrystalline material 22.

Figure 14:
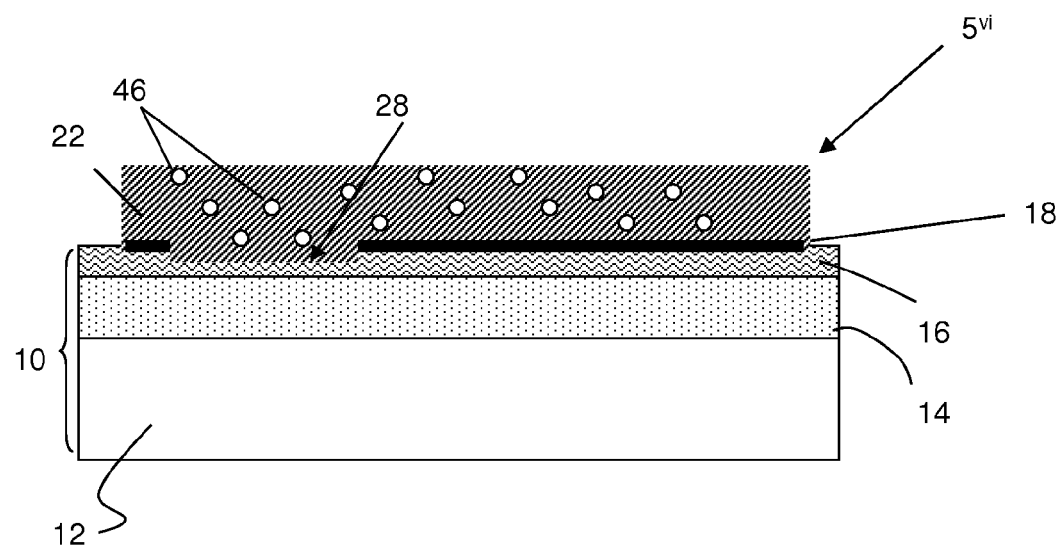
FIGS. 14 and 15 show processing steps and respective structures in accordance with additional aspects of the present invention.
Figure 15:
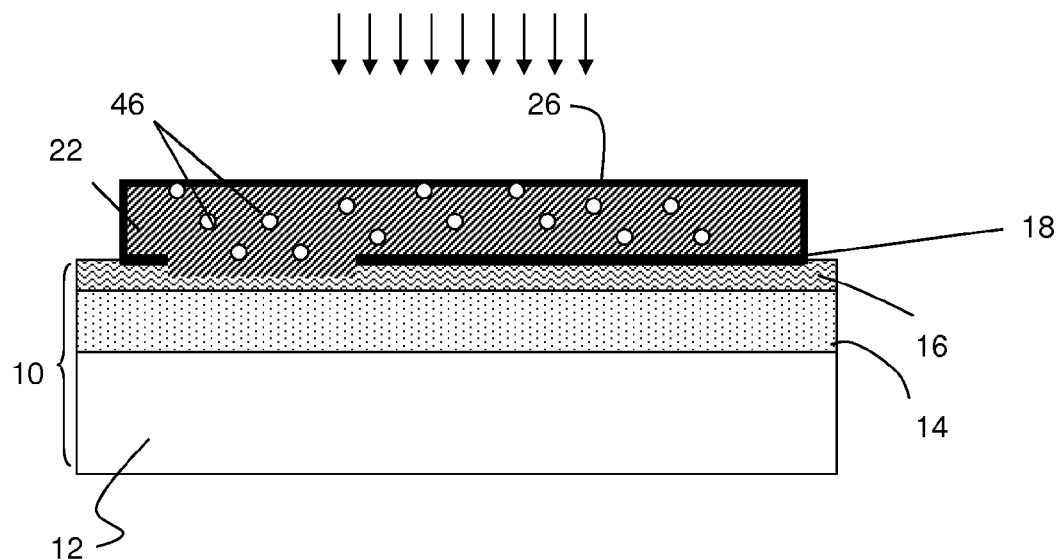

FIGS. 14 and 15 show processing steps and respective structures in accordance with additional aspects of the present invention. More specifically, FIG. 14 shows a structure $5^{vi}$ comprising either a bulk wafer or an SOI wafer 10 as already described herein. An encapsulating material 18, e.g., nitride, oxide or other hardmask materials, is deposited and patterned on the active semiconductor layer 16. During the patterning of the encapsulating material 18, an opening 28 is formed in the encapsulating material 18 to expose the underlying semiconductor layer 16. The underlying semiconductor layer 16 will act as a seed layer to crystallize the amorphous or polycrystalline material, e.g., Ge or other III-V compound material, during subsequent annealing processes.

As further shown in FIG. 14, amorphous or polycrystalline material 22, e.g., Ge or other III-V compound material, is formed on the encapsulating material 18 and the exposed underlying semiconductor layer 16. In this process, the amorphous or polycrystalline material 22 is formed by a plasma vapor deposition (PVD) process with argon or other inert gas. In this process, the argon or other inert gas creates pores 46 in the amorphous or polycrystalline material 22.

As shown in FIG. 15, an encapsulating material 26, e.g., nitride, oxide or other hardmask material, is formed over the amorphous or polycrystalline material 22. As represented by the arrows, the amorphous or polycrystalline material 22 undergoes an annealing process greater than the melting point of material 22, e.g., greater than about 950° C. for Ge. During this annealing process, the gas in the pores 46 dissolve or outdiffuse from the amorphous or polycrystalline material 22 such that voids in the amorphous or polycrystalline material 22 are available to relieve stress. As should be understood by those of skill in the art, the annealing process will crystallize the amorphous or polycrystalline material 22.

FIGS. 16-20 show various respective structures and related processing steps in accordance with various aspects of the present invention. In each of these structures, voids, holes or other patterns permit expansion of the amorphous or polycrystalline material 22, to prevent cracking of the encapsulating material. As should be understood by those of skill in the art, each of the structures formed in FIGS. 16-20 can be fabricated using conventional CMOS processes as described herein. Also, any of the structures shown in FIGS. 16-20 can be provided in any combination with or without any combination of structures shown in FIGS. 1-15.

Figure 16:
FIGS. 16-20 show various respective structures and related processing steps in accordance with various aspects of the present invention.
Figure 17:
Figure 18:
Figure 19:
Figure 20:
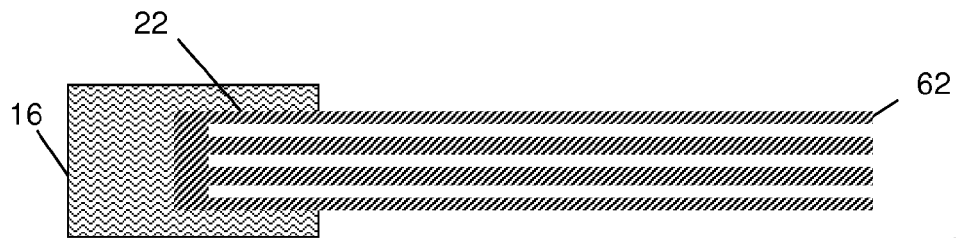

By way of example, FIG. 16 shows a tap hole 50 formed in the amorphous or polycrystalline material 22. FIG. 16 also shows an optional narrow region (e.g., necking) 52. In embodiments, the optional narrow region 52 will prevent the tap hole 50 from expanding to a sensor area. FIG. 17 shows a tap hole 56 formed over the active semiconductor layer 16, remote from the exposed portion of the underlying active semiconductor layer (e.g., crystallization window) 54. FIG. 17 further shows the amorphous or polycrystalline material 22 with a tapered profile 57 (which provides additional room for expansion). FIG. 18 shows the amorphous or polycrystalline material 22 over either polysilicon structures or STI structures, both represented as reference numeral 58. (This embodiment is similar to that shown in FIGS. 3 and 4.) In embodiments, the polysilicon structures 58 will act as seed structures for crystallization structures. FIG. 19 shows gaps or trenches 60 formed in the amorphous or polycrystalline material 22 (similar to the embodiment shown in FIG. 13). FIG. 19 also shows an optional narrow region (e.g., necking) 52, which will prevent the gaps or trenches 60 from expanding to a sensor area. FIG. 20 shows gaps or strips 62 extending along the length of the amorphous or polycrystalline material 22 (sensor area).

Figure 21:
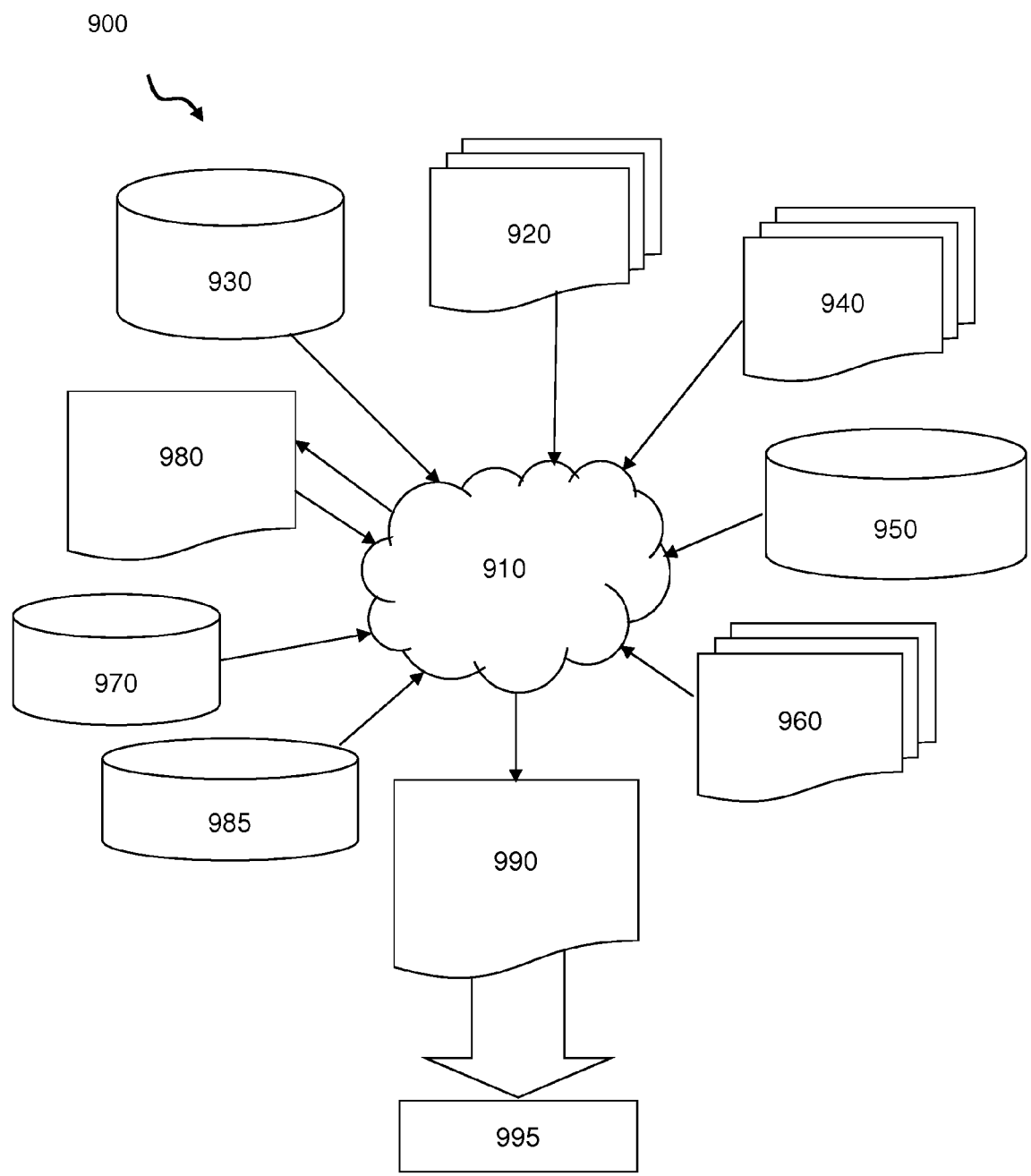
FIG. 21 is a flow diagram of a design process used in semiconductor design, manufacture, and/or test.

FIG. 21 is a flow diagram of a design process used in semiconductor design, manufacture, and/or test. FIG. 21 shows a block diagram of an exemplary design flow 900 used for example, in semiconductor IC logic design, simulation, test, layout, and manufacture. Design flow 900 includes processes, machines and/or mechanisms for processing design structures or devices to generate logically or otherwise functionally equivalent representations of the design structures and/or devices described above and shown in FIGS. 1-20. The design structures processed and/or generated by design flow 900 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 900 may vary depending on the type of representation being designed. For example, a design flow 900 for building an application specific IC (ASIC) may differ from a design flow 900 for designing a standard component or from a design flow 900 for instantiating the design into a programmable array, for example a programmable gate array (PGA) or a field programmable gate array (FPGA) offered by Altera® Inc. or Xilinx® Inc.

FIG. 21 illustrates multiple such design structures including an input design structure 920 that is preferably processed by a design process 910. Design structure 920 may be a logical simulation design structure generated and processed by design process 910 to produce a logically equivalent functional representation of a hardware device. Design structure 920 may also or alternatively comprise data and/or program instructions that when processed by design process 910, generate a functional representation of the physical structure of a hardware device. Whether representing functional and/or structural design features, design structure 920 may be generated using electronic computer-aided design (ECAD) such as implemented by a core developer/designer. When encoded on a machine-readable data transmission, gate array, or storage medium, design structure 920 may be accessed and processed by one or more hardware and/or software modules within design process 910 to simulate or otherwise functionally represent an electronic component, circuit, electronic or logic module, apparatus, device, or system such as those shown in FIGS. 1-20. As such, design structure 920 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 910 preferably employs and incorporates hardware and/or software modules for synthesizing, translating, or otherwise processing a design/simulation functional equivalent of the components, circuits, devices, or logic structures shown in FIGS. 1-20 to generate a netlist 980 which may contain design structures such as design structure 920. Netlist 980 may comprise, for example, compiled or otherwise processed data structures representing a list of wires, discrete components, logic gates, control circuits, I/O devices, models, etc. that describes the connections to other elements and circuits in an integrated circuit design. Netlist 980 may be synthesized using an iterative process in which netlist 980 is resynthesized one or more times depending on design specifications and parameters for the device. As with other design structure types described herein, netlist 980 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 910 may include hardware and software modules for processing a variety of input data structure types including netlist 980. Such data structure types may reside, for example, within library elements 930 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 940, characterization data 950, verification data 960, design rules 970, and test data files 985 which may include input test patterns, output test results, and other testing information. Design process 910 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 910 without deviating from the scope and spirit of the invention. Design process 910 may also include modules for performing standard circuit design processes such as timing analysis, verification, design rule checking, place and route operations, etc.

Design process 910 employs and incorporates logic and physical design tools such as HDL compilers and simulation model build tools to process design structure 920 together with some or all of the depicted supporting data structures along with any additional mechanical design or data (if applicable), to generate a second design structure 990.

Design structure 990 resides on a storage medium or programmable gate array in a data format used for the exchange of data of mechanical devices and structures (e.g. information stored in a IGES, DXF, Parasolid XT, JT, DRG, or any other suitable format for storing or rendering such mechanical design structures). Similar to design structure 920, design structure 990 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 1-20. In one embodiment, design structure 990 may comprise a compiled, executable HDL simulation model that functionally simulates the devices shown in FIGS. 1-20.

Design structure 990 may also employ a data format used for the exchange of layout data of integrated circuits and/or symbolic data format (e.g. information stored in a GDSII (GDS2), GL1, OASIS, map files, or any other suitable format for storing such design data structures). Design structure 990 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 1-20. Design structure 990 may then proceed to a stage 995 where, for example, design structure 990: proceeds to tape-out, is released to manufacturing, is released to a mask house, is sent to another design house, is sent back to the customer, etc.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method, comprising:
   forming an amorphous or polycrystalline material in contact with a layer of seed material;

forming an expansion space for the amorphous or polycrystalline material;

forming an encapsulation structure about the amorphous or polycrystalline material; and crystallizing the amorphous or polycrystalline material by a thermal anneal process such that the amorphous or polycrystalline material expands within the expansion space.

2. The method of claim 1, wherein the forming of the expansion space comprises forming voids between polysilicon structures formed on an underlying encapsulating layer of the encapsulation structure, wherein:

the forming of the polysilicon structures comprises:
depositing polysilicon material on the underlying encapsulating layer; and
patterning the polysilicon material to have a minimal spacing therebetween; and the forming of the voids comprises depositing the amorphous or polycrystalline material over the polysilicon structures, which only partly fills the minimum spacing.

3. The method of claim 1, wherein the forming of the expansion space comprises forming voids within trenches formed in an underlying active silicon material, wherein:

the forming of the trenches comprises:
exposing the underlying active silicon material by etching an opening in a first encapsulating layer which partly forms the encapsulation structure; and
etching the exposed underlying active silicon material to form the trenches with a minimum dimension; and
the forming of the voids comprises partly filling the trenches with the amorphous or polycrystalline material.

4. The method of claim 1, wherein prior to the crystallizing of the amorphous or polycrystalline material the forming of the expansion space comprises:

forming an upper encapsulating layer which partly forms the encapsulation structure;
forming an opening in the upper encapsulating layer;
removing portions of the amorphous or polycrystalline material through the opening; and
sealing the opening, wherein:
a lower encapsulating layer partly forming the encapsulation structure is formed on an underlying semiconductor layer;
the lower encapsulating layer is patterned to expose a portion of the underlying semiconductor layer, which acts as the layer of seed material; and
the amorphous or polycrystalline material is deposited on the lower encapsulating layer and the underlying semiconductor layer.

5. The method of claim 1, wherein prior to the crystallizing of the amorphous or polycrystalline material the forming of the expansion space comprises:

oxidizing the amorphous or polycrystalline material;
forming an upper encapsulating layer over the oxidized amorphous or polycrystalline material, the upper encapsulating layer partly forming the encapsulation structure;
forming an opening in the upper encapsulating layer;
removing the oxidized amorphous or polycrystalline material through the opening; and
sealing the opening, wherein:
a lower encapsulating layer is formed on an underlying semiconductor layer;
the lower encapsulating layer is patterned to expose a portion of the underlying semiconductor layer, which acts as the layer of seed material; and
the amorphous or polycrystalline material is deposited on the lower encapsulating layer and the underlying semiconductor layer.

6. The method of claim 1, wherein prior to the crystallizing of the amorphous or polycrystalline material the forming of the expansion space comprises:

forming an oxidizing amorphous or polycrystalline material on the amorphous or polycrystalline material;
forming an upper encapsulating layer over the oxidized amorphous or polycrystalline material, the upper encapsulating layer partly forming the encapsulation structure;
forming an opening in the upper encapsulating layer;
removing the oxidized amorphous or polycrystalline material through the opening; and
sealing the opening, wherein:
a lower encapsulating layer is formed on an underlying semiconductor layer;
the lower encapsulating layer is patterned to expose a portion of the underlying semiconductor layer, which acts as the layer of seed material; and
the amorphous or polycrystalline material is deposited on the lower encapsulating layer and the underlying semiconductor layer.

7. The method of claim 1, wherein the forming of the expansion space comprises forming trenches within the amorphous or polycrystalline material, prior to the encapsulating.

8. The method of claim 7, wherein:
the trenches formed within the amorphous or polycrystalline material are provided above a lower encapsulating layer formed on an active semiconductor layer;
the lower encapsulating layer is patterned to expose the active semiconductor layer; and
the exposed active semiconductor layer is the layer of seed material for the amorphous or polycrystalline material.

9. The method of claim 1, wherein the forming of the expansion space comprises forming pores within the amorphous or polycrystalline material by flowing inert gas during a deposition of the amorphous or polycrystalline material.

10. The method of claim 9, wherein during the thermal anneal process gas outdiffuses from the pores to form voids for the expansion of the amorphous or polycrystalline material.

11. The method of claim 1, wherein the forming of the expansion space comprises forming trenches within an underlying shallow trench isolation structure and partly filling the trenches by depositing the amorphous or polycrystalline material therein.

12. The method of claim 1, wherein the forming of the expansion space comprises at least one of tapering and narrowing portions of the amorphous or polycrystalline material within the encapsulation structure.

13. A method, comprising:
forming a lower encapsulating layer on an active semiconductor layer;
forming an amorphous or polycrystalline material on the lower encapsulating layer and in contact with a layer of seed material;
forming an upper encapsulating layer over the amorphous or polycrystalline material to fully encapsulate the amorphous or polycrystalline material;
forming an expansion space for the amorphous or polycrystalline material under the upper encapsulating layer; and
annealing the amorphous or polycrystalline material which crystallizes and expands within the expansion space.

14. The method of claim 13, wherein:
the lower encapsulating layer is patterned to expose the active semiconductor layer, which acts as the layer of seed material; and
the expansion space is formed by depositing the amorphous or polycrystalline material partly within trenches formed within the active semiconductor layer.

15. The method of claim 13, wherein the expansion space is formed by depositing the amorphous or polycrystalline material partly between polysilicon structures which have a minimum spacing and which are formed on the lower encapsulating layer.

16. The method of claim 13, wherein the expansion space is formed by forming trenches within the amorphous or polycrystalline material.

17. The method of claim 13, wherein the expansion space is formed by removing amorphous or polycrystalline material under the upper encapsulating layer.

18. The method of claim 13, wherein the expansion space is formed by removing oxidized amorphous or polycrystalline material under the upper encapsulating layer.

19. The method of claim 13, wherein the expansion space is formed by flowing inert gas during a deposition of the amorphous or polycrystalline material and outdiffusion of the inert gas during the thermal annealing.

* * * * *